United States Patent [19]

Kamp et al.

[11] Patent Number: 4,965,711
[45] Date of Patent: Oct. 23, 1990

[54] SWITCHED CAPACITOR NETWORK

[75] Inventors: Petrus J. M. Kamp; Arthur H. M. Van Roermund, both of Eindhoven, Netherlands

[73] Assignee: U.S. Philips Corp., New York, N.Y.

[21] Appl. No.: 501,399

[22] Filed: Mar. 27, 1990

Related U.S. Application Data

[63] Continuation of Ser. No. 288,845, Dec. 21, 1988, abandoned.

[30] Foreign Application Priority Data

Dec. 29, 1987 [NL] Netherlands ............... 8703152

[51] Int. Cl.$^5$ .................... H02M 7/25; H03F 1/32
[52] U.S. Cl. ............................. 363/60; 320/1;
320/5; 320/21; 330/9; 357/51; 307/240
[58] Field of Search ............ 363/60; 320/1, 5, 21;
330/9, 84, 107; 328/127, 151; 324/111, 142;
357/36, 41, 51; 307/240

[56] References Cited

U.S. PATENT DOCUMENTS 4,387,345 6/1983 Kelley ........................ 330/9
4,471,482 9/1984 Cluwen ...................... 307/240
4,786,863 11/1988 Milkovic ..................... 330/9

FOREIGN PATENT DOCUMENTS 0024011 2/1981 European Pat. Off. .

OTHER PUBLICATIONS

Philips Technical Review, vol. 41, No. 4, 1983/84 pp. 105–123, Van Roermund et al., "An Integrated Switched Capacitor Filter for Viewdata".

Primary Examiner—Steven L. Stephan
Assistant Examiner—Emanuel Todd Voeltz
Attorney, Agent, or Firm—Steven R. Biren

[57] ABSTRACT

A switched capacitor network includes an input terminal (2) an output terminal (2), a series arrangement of a first and a second switching transistor, each having a control electrode ($S_1$) for receiving a first ($S_1$) and a second switching signal, respectively, and a capacitance between the junction point of the two switching transistors and a point of constant potential. The two switching transistors have a zone in common and the capacitance ($S_s$) is exclusively constituted by the parasitic capacitance of the zone (17). This structure results in a switched capacitor network with an increased time constant.

8 Claims, 3 Drawing Sheets

SWITCHED CAPACITOR NETWORK

This is a continuation of application Ser. No. 288,845, filed Dec. 21, 1988, now abandoned.

BACKGROUND OF THE INVENTION

The invention relates to a switched capacitor network, comprising an input terminal and an output terminal, a series arrangement of at least a first and a second successive switching transistor arranged between the input terminal and the output terminal, each switching transistor having a control electrode for receiving a switching signal, and a capacitance between the junction point of the first and the second switching transistor in the series arrangement and a point of constant potential, the control electrodes of the first and the second switching transistor being adapted to receive a first and a second switching signal, respectively, each of the two switching signals being in the form of a number of one or more successive pulses, which number is equal for both switching signals, the pulse(s) of the first switching signal not overlapping those of the second switching signal with respect to time and the frequencies of occurrence of the pulses in the two switching signals being substantially equal if said number of pulses is two or more.

A capacitor network of this type is known, for example, from Philips Technisch Tijdschrift 41, 1983, no. 4, pages 109-129. The Article in this Journal relates to the use of a switched capacitor network in a switched capacitor integrator. Another switched capacitor network is shown in EP 0 024 011.

The time constant of the switched capacitor integrator in the Philips Journal is too small for some applications and it would be desirable to obtain a larger time constant for such applications.

SUMMARY OF THE INVENTION

It is an object of the invention to provide a switched capacitor network which, when applied in a switched capacitor integrator, provides the possibility of realizing larger time constants. To this end, the switched capacitor network is characterized in that the two successive first and second switching transistors in the series arrangement have a zone in common and in that the capacitance is exclusively constituted by the parasitic capacitance of the common zone.

The time constant of the switched capacitor integrator is proportional to $C_f/C_s$ in which $C_s$ is the aforementioned capacitance arranged between the junction point of the two switching transistors and the point of constant potential (ground) and $C_f$ is the value of the negative feedback capacitor arranged between the output and the inverting input of the operational amplifier arranged behind the capacitor network.

The maximum value of $C_f/C_s$ depends on the minimum value of $C_s$ and on the maximum value which, within certain economic and technological limits, can be given to $C_f$. Due to limitations at the level of the integration of $C_f$ in an integrated circuit, $C_f$ cannot be chosen to be too large. The minimum value of $C_s$ is limited by the parasitic capacitances of the switching transistors.

According to the invention this knowledge is utilized by effectively determining the capacitance $C_s$ by means of the parasitic capacitances of the two switching transistors. This means that no capacitor is required between the junction point of the two switching transistor and the point of constant potential.

However, provided that it is ensured that two successive switching transistors in the series arrangement have a (semiconductor) zone in common, the afore-mentioned capacitance, which is equal to the parasitic capacitance of this common zone, will have a sufficiently low capacitance to realize a desired, sufficiently large time constant in the switched capacitor integrator.

Dependent on the technology and the type of switching transistor a capacitance of approximately 5 to 25 fF ($1fF = 10^{-15}F$) can be realized.

Moreover, the realization of a (semiconductor) zone which is common for two successive switching transistors results in an economy of space on the substrate, which leads to smaller circuits. The negative feedback capacitor may also be much smaller, which leads to a considerably larger economy of space on the substrate.

The switched capacitor network comprising a series arrangement of a first and a second switching transistor may be further characterized in that the network also comprises a second series arrangement of a third and a fourth switching transistor each having a control electrode for receiving a switching signal, in that the third and the fourth switching transistor have a zone in common and in that the second series arrangement is arranged in parallel with the series arrangement of the first and the second switching transistor.

This provides the possibility of compensating for the offset voltage which is present due to asymmetry in the switching transistors. Different specific layout configurations can now be proposed to reduce the offset voltage.

BRIEF DESCRIPTION OF THE DRAWING

The invention will now be described in greater detail, by way of example, with reference to the accompanying drawing in which.

DESCRIPTION OF THE PREFERRED EMBODIMENT

Figure 1:
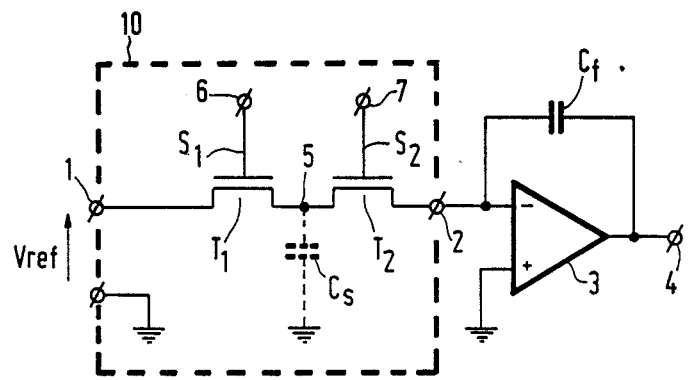
FIG. 1 shows a circuit diagram of a first embodiment.

FIG. 1 shows an embodiment of a switched capacitor network 10 comprising a series arrangement of a first and a second switching transistor $T_1$ and $T_2$, respectively, between an input terminal 1 and an output terminal 2. FIG. 1 shows the use of the capacitor network in a switched capacitor integrator. To this end the output terminal 2 is coupled to the inverting input (−) of an operational amplifier 3. Its output 4 is coupled to the inverting input via a negative feedback capacitor $C_f$. The non-inverting input (+) of the amplifier 3 is coupled to a point of constant potential (ground).

The two switching transistors $T_1$ and $T_2$ have a zone in common. For the (MOS) transistor $T_1$ this is the zone on which normally the drain electrode is arranged and for the (MOS) transistor $T_2$ this is the zone on which normally the source electrode is arranged. This will be explained in greater detail with reference to FIG. 3. The two switching transistors $T_1$ and $T_2$ each have a control electrode (the gate electrode) which is electrically coupled to terminals 6 and 7, respectively. A first and a second switching signal $S_1$ and $S_2$ can be applied to the terminals 6 and 7, respectively. See FIG. 1a which shows the two switching signals as a function of time. In the absence of a switching signal, i.e. the switching signal is low, the switching transistors are turned off. This means that they represent an open switch. Under the influence of the switching signal, or in other words, when the switching signal is "high", the switching transistors are turned on, that is to say, they constitute a switch in the closed position. It is evident that the switching transistors are N-MOS transistors in this case. If the switching transistors are P-MOS transistors, the switching signals should of course be applied in an inverted form to the terminals 6 and 7.

The capacitance between the junction point 5 of the two switching transistors $T_1$ and $T_2$ and the point of constant potential (ground) is determined and solely formed by the parasitic capacitances of the two switching transistors. Thus no separate capacitor is arranged between the point 5 and "ground".

Figure 2:
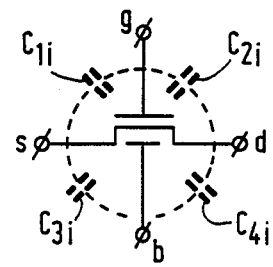
FIG. 2 shows the parasitic capacitances of a switching transistor.

FIG. 2 shows the parasitic capacitances of a MOS switching transistor $T_i$, in which i in accordance with FIG. 1 may be equal to 1 or 2. A parasitic capacitance $C_{1i}$ is present between the source electrode s and the gate electrode g, a parasitic capacitance $C_{2i}$ is present between the gate electrode g and the drain electrode d, and parasitic capacitances $C_{3i}$ and $C_{4i}$ are present between the source electrode and the bulk terminal b and between the drain electrode and the bulk terminal b, respectively.

Figure 3:
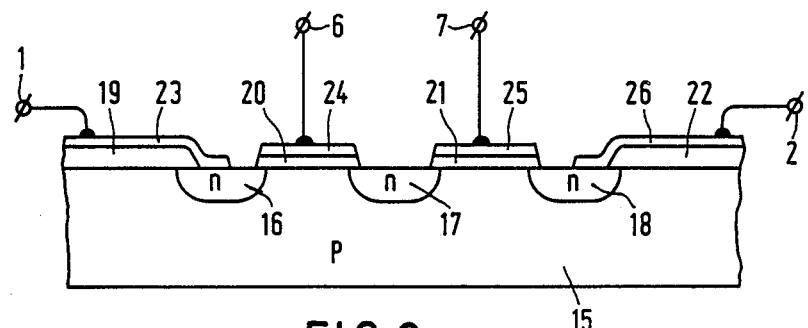
FIG. 3 shows the structure of the network of FIG. 1 in a vertical cross-section through the substrate of the circuit.

FIG. 3 is a cross-section of the switched capacitor network of FIG. 1 as arranged in an integrated form in the substrate. In this case an N-MOS design is used. FIG. 3 shows a p-doped substrate 15 in which n-doped zones 16, 17 and 18 are provided. Insulating oxide layers 19, 20, 21 and 22 are provided on the substrate. These layers in turn carry conducting layers in the form of conducting silicon layers 23, 24, 25 and 26.

The conducting layer 23 constitutes the source electrode of switching transistor $T_1$ and is electrically coupled to the input terminal 1. The conducting layer 24 constitutes the gate electrode of switching transistor $T_1$ and is coupled to the control signal input 6. The conducting layer 25 constitutes the gate electrode of switching transistor $T_2$ which is coupled to the control signal input 7. The conducting layer 26 constitutes the drain electrode of the switching transistor $T_2$ which is electrically coupled to the output terminal 2. The switching transistor $T_1$ and the switching transistor $T_2$ have the zone 17 in common. Consequently, this common zone is the n-zone 17. Thus there is no drain electrode of the switching transistor $T_1$ and no source electrode of the switching transistor $T_2$ physically present on the substrate. At the area of the zone 17 there is no external capacitor which could serve as a capacitance between the junction point of the two switching transistors and the point of constant potential (ground). Only the parasitic capacitance of the common zone 17 is present. This parasitic capacitance $C_s$ (see FIG. 1) is actually constituted by the sum of the parasitic capacitances $C_{21}$ and $C_{41}$ of switching transistor $T_1$ and the parasitic capacitances $C_{12}$ and $C_{32}$ of the switching transistor $T_2$, see FIG. 2.

The operation of the switched capacitor integrator of FIG. 1 will hereinafter be described in greater detail with reference to the switching signals of FIG. 1a.

Figure 1A:
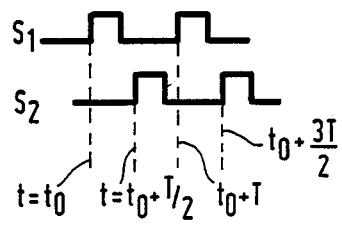
FIG. 1a shows the two switching signals for the switching transistors in the first embodiment.

FIG. 1a shows the first switching signal $S_1$ which is applied to the control electrode 6 of the first switching transistor $T_1$ and the second switching signal $S_2$ which is applied to the control electrode 7 of the second transistor $T_2$. Both switching signals are in the form of pulse series. The pulses have a frequency $f_n$ of occurrence for which it holds that $f_n = 1/T$ in which T is the period in a pulse series.

The pulses of the second switching signal $S_2$ are shifted with respect to time over $T_2$ with respect to the pulses in the first switching signal $S_1$. The pulses in the first and the second switching signal do not overlap one another with respect to time.

Under the influence of the pulse at the instant $t = t_0$ in the switching signal $S_1$, the switching transistor $T_1$ is turned on for a short period from the instant $t_0$. The parasitic capacitance $C_s$ is now charged to the voltage Vref which is present at the input 1 of the integrator. It is assumed that the capacitor $C_f$ is discharged in advance by a reset signal which is applied to a switch (not shown) arranged parallel to the capacitor $C_f$, which switch closes for a short period for this purpose. Under the influence of signal $S_2$ the switching transistor $T_2$ will subsequently be turned on for a short period from the instant $t_0 + T/2$. As a result, the capacitance $C_s$ is discharged and the capacitor $C_f$ is charged. A voltage which is equal to $$-Vref.C_s/C_f = \alpha.Vref$$

is then produced at the output 4. Subsequently a pulse is applied to the switching transistor $T_1$ at the instant $t = t_0 + T$ and a pulse is applied to the switching transistor $T_2$ at the instant $t = t_0 + 3T/2$. A voltage which is equal to $$2.\alpha.Vref.$$

is then produced at the output 4. After each subsequent combination of a pulse in the switching signal $S_1$ and a pulse in the switching signal $S_2$ the output voltage will have increased each time by $\alpha.Vref$.

The time constant $\tau$ of the integrator of FIG. 1 is given by $$\tau = C_f/C_s f_n.$$

The parasitic capacitance $C_s$, together with the pulse frequency $f_n$, defines an effective resistance R. This effective resistance, together with $C_f$, defines the time constant $\tau$ and is equal to $R = 1/C_s f_n$.

A large time constant is produced by choosing $f_n$ to be low and $C_f/C_s$ to be large.

In practice the lower limit for $f_n$ is determined by the bandwidth of the input signal and the sampling theorem and by the technological limitations resulting in leakage currents.

The maximum value of $C_f/C_s$ depends on the minimum value of $C_s$ and the value which can be given to $C_f$ within certain economic and technological limits. In practice $C_f$ will be chosen to be not larger than 50–100 pF. The minimum value of $C_s$ is limited by the parasitic capacitances of the two switching transistors. By having the capacitance $C_s$ determined solely by the parasitic capacitances of the switching transistors, a very low capacitance can be realized. Dependent on the technology and the type of switching transistor the switched capacitance $C_s$ will have a value of approximately 5–25 fF. With $C_f$ of 50 pF and $C_s$ of 5 fF, a time constant of 0.1 s. can be realized at a clock frequency $f_n$ of 100 kHz.

Practical tests on the circuit of FIG. 1 have proved that it is realizable and usable. It has also been found that the offset voltage, which results from the asymmetry in the switching transistor, plays an important role. Particularly the gate-source and gate-drain overlap capacitances $C_{11}$ and $C_{22}$ are concerned.

For this reason specific layout configurations are proposed for the relevant input circuit 10 with the switched parasitic capacitance $C_s$ to reduce the offset voltage.

Figure 4:
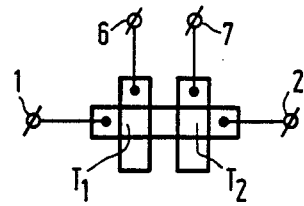
FIG. 4 shows the network of FIG. 1 in a more diagrammatical form.

The indication of a switched capacitor network such as the network 10 in FIG. 1 will hereinafter be given in the form as shown in FIG. 4.

Figure 5A:
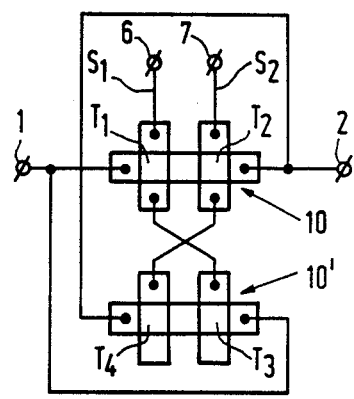
FIGS. 5 and 5b show two different layout configurations of a second embodiment.

FIG. 5 shows the switched capacitor network 10 in FIG. 5a with which a second switched capacitor network 10' comprising a series arrangement of a third and a fourth switching transistor $T_3$ and $T_4$ is arranged in parallel. The control electrodes of the switching transistors $T_1$ and $T_3$ are coupled together. Similarly, the control electrodes of the switching transistors $T_2$ and $T_4$ are coupled together. This compensates for the geometrical asymmetry of the switching transistors, which is the result of limitations in the manufacturing process, so that a reduced offset voltage is obtained.

Figure 5B:
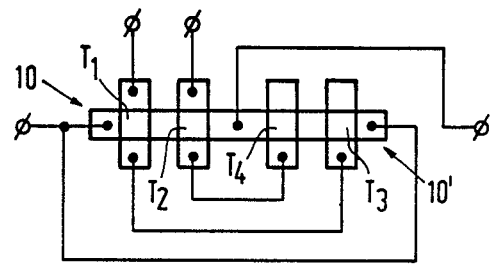

FIG. 5b shows an alternative layout; the switching transistors are slightly further apart and are aligned. It is true that the compensation will usually be reduced thereby, but the circuit has the advantage that the various connection leads do not cross one another so that parasitic coupling capacitances are not produced.

Figure 6A:
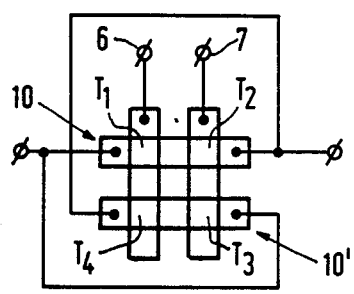
FIGS. 6a and 6b show two different layout configurations of a third embodiment in FIGS. 6a and 6b.
Figure 6B:
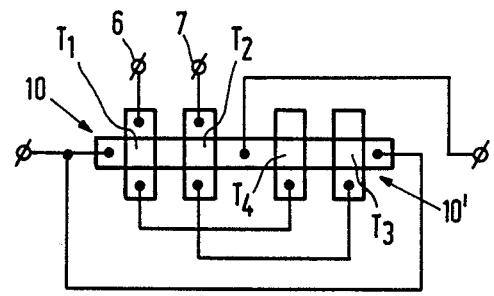
Figure 7:
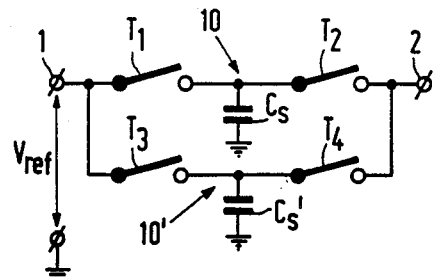
FIG. 7 shows the electrical circuit diagram of the embodiments of FIGS. 5 and 6.

FIGS. 6a and 6b show two alternatives, in which the associated circuit diagram is now slightly modified: the two parallel capacitor networks are now switched out of phase (see FIG. 7). This has the additional advantage that clock asymmetry is also compensated for. In addition it provides the possibility of realizing the layout of FIG. 6a in which the gate structures of the compensating switches are uninterrupted. This may further reduce the sensitivity to geometrical errors (notably mask errors).

FIG. 7 shows the electrical circuit diagram of the two parallel-arranged capacitor networks 10 and 10'. The switching transistors $T_1$ to $T_4$ are shown as switches. $C_s'$ is the parasitic capacitance of the zone which is common to the switching transistors $T_3$ and $T_4$.

In the networks according to FIGS. 5a and 5b the switches $T_1$ and $T_3$ are first closed simultaneously. This means that the two parasitic capacitances $C_s$ and $C_s'$ are charged to the voltage $Vref_1$ which is present at the input terminal 1. After the switches $T_1$ and $T_3$ have been opened, the switches $T_2$ and $T_4$ close simultaneously and the two capacitances are discharged via the output terminal 2.

In the networks according to FIGS. 6a and 6b the switches $T_1$ and $T_4$ are closed simultaneously. This means that the capacitance $C_s$ is charged to the voltage Vref and the capacitance $C_s'$ is discharged via the output terminal 2. Subsequently, the switches $T_1$ and $T_4$ are opened and then the switches $T_2$ and $T_3$ close simultaneously. This means that the capacitance $C_s$ is discharged via the output terminal 2, whilst the capacitance $C_s'$ is charged to the voltage Vref.

Figure 8A:
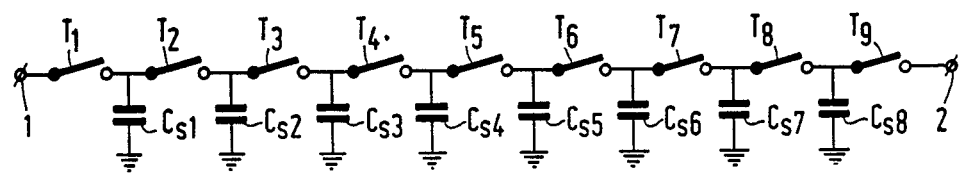
FIG. 8 shows a series arrangement of nine switching transistors and the layout configuration the circuit of, and FIG. 9 shows a layout configuration of a series arrangement of eight switching transistors.

A further reduction of the (effectively) switched capacitance may be obtained by arranging a larger number of switches in series, as in FIG. 8a. The network comprises nine series-arranged switching transistors $T_1$ to $T_9$ in which each time two successive switching transistors $T_i$ and $T_{i+1}$ have a zone in common. The common zone then has a parasitic capacitance $C_{si}$.

Figure 8B:
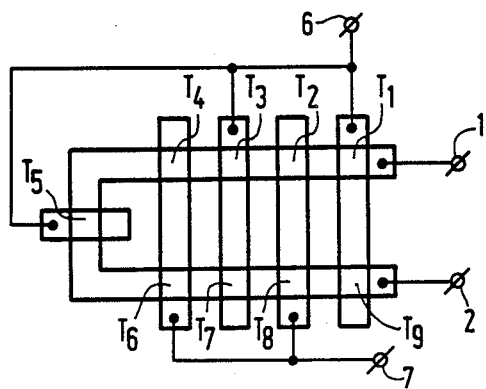

A compensation is also possible for such a network, see FIG. 8b. The nine switching transistors are to this end arranged along a U-shaped line on the substrate.

Figure 9:
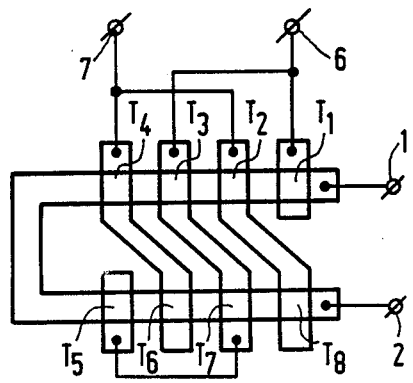

FIG. 9 shows an embodiment in which eight series-arranged switching transistors $T_1$ to $T_8$ are arranged along a U-shaped line on the substrate.

It is to be noted that the invention is not limited to the embodiments shown. The invention may also be used for those embodiments which differ from the embodiments shown in aspects not relating to the invention. For example, the networks are not limited to their use in a switched capacitor network, but they can generally be used where (parasitic) capacitances are switched.

What is claimed is:

1. A switched capacitor network, comprising an input terminal and an output terminal, a series arrangement of at least a first and a second successive switching transistor arranged between the input terminal and the output terminal, each switching transistor having a control electrode for receiving a switching signal, and a capacitance between the junction point of the first and the second switching transistor in the series arrangement and a point of constant potential, the control electrodes of the first and the second switching transistor being adapted to receive a first and a second switching signal, respectively, each of the two switching signals being in the form of a number of one or more successive pulses, which number is equal for both switching signals, the pulses of the first switching signal not overlapping those of the second switching signal with respect to time, and the frequencies of occurrence of the pulses in the two switching signals being substantially equal if said number of pulses is two or more, characterized in that the two successive first and second switching transistors in the series arrangement have a common semiconductor zone which comprises an active zone of each of said transistors and in that the capacitance consists solely of the parasitic capacitance of the common semiconductor zone.

2. A switched capacitor network as claimed in claim 1, characterized in that the network also comprises a second series arrangement of a third and a fourth switching transistor each having a control electrode for receiving a switching signal, in that the third and fourth switching transistor have a zone in common and in that the second series arrangement is arranged in parallel with the series arrangement of the first and the second switching transistor.

3. A switched capacitor network as claimed in claim 2, characterized in that the control electrodes of the first and the third switching transistor are coupled together and in that the control electrodes of the second and the fourth switching transistor are coupled together.

4. A switched capacitor network as claimed in claim 2, characterized in that the control electrodes of the first and the fourth switching transistor are coupled together and in that the control electrodes of the second and the third switching transistor are coupled together.

5. A switched capacitor network as claimed in claim 3 or 4, characterized in that the four switching transistors are arranged on a substrate along a straight line.

6. A switched capacitor network as claimed in claim 3 or 4, characterized in that the two series arrangements of two transistors are arranged in parallel and adjacent to each other on a substrate.

7. A switched capacitor network as claimed in claim 1, comprising n series-arranged switching transistors, characterized in that for each set of two successive switching transistors it holds that they have a zone in common, in that the switching transistors with an ordinal number i (i odd and larger than zero) have control electrodes which are electrically coupled together for receiving the first switching signal, and in that the switching transistors with ordinal number i+1 have control electrodes which are also electrically coupled together for receiving the second switching signal.

8. A switched capacitor network as claimed in claim 7, characterized in that the n switching transistors are arranged along a U-shaped line on a substrate, in that for n being odd the switching transistors 1 to (n−1)/2 are arranged along the one leg of the U on the substrate, in that the switching transistors (n+3)/2 to n are arranged along the other leg of the U on the substrate and in that the (n+1)/2nd switching transistor is arranged on the remaining part of the U, and in that for n being even the switching transistors 1 to n/2 are arranged along the one leg of the U on the substrate and the switching transistors (n+2)/2 to n are arranged along the other leg of the U on the substrate.

* * * * *